United States Patent
Li et al.

(10) Patent No.: US 7,626,436 B2
(45) Date of Patent: Dec. 1, 2009

(54) AUTOMATIC SYSTEM CLOCK DETECTION SYSTEM

(75) Inventors: Shawn Shaojie Li, Austin, TX (US);
Akhlesh Nigam, Austin, TX (US);
Mark R. Bohm, Village of Bear Creek, TX (US); Michael J. Pennell, Phoenix, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 191 days.

(21) Appl. No.: 11/939,670

(22) Filed: Nov. 14, 2007

(65) Prior Publication Data
US 2008/0191756 A1    Aug. 14, 2008

Related U.S. Application Data

(60) Provisional application No. 60/889,431, filed on Feb. 12, 2007.

(51) Int. Cl.
*G06F 1/04*    (2006.01)
(52) U.S. Cl. .......................................... 327/291; 327/47
(58) Field of Classification Search ........................ None
See application file for complete search history.

(56) References Cited

U.S. PATENT DOCUMENTS

| 4,672,325 A | 6/1987 | Murai |
| 5,905,887 A | 5/1999 | Wu et al. |
| 6,065,129 A | 5/2000 | Sakamoto et al. |
| 6,707,320 B2 | 3/2004 | Trivedi et al. |
| 6,741,668 B1 | 5/2004 | Nakamura |
| 6,816,979 B1 | 11/2004 | Chen et al. |
| 6,900,701 B2 | 5/2005 | Chan |
| 6,937,680 B2 | 8/2005 | Fong et al. |
| 6,985,811 B2 | 1/2006 | Gronemeyer |
| 7,002,377 B2 | 2/2006 | Mori |
| 7,239,971 B2 * | 7/2007 | Miller ......................... 702/89 |
| 7,259,595 B2 | 8/2007 | Kim |
| 7,340,633 B2 | 3/2008 | Convent et al. |
| 7,352,214 B2 | 4/2008 | Evans et al. |
| 2006/0267194 A1 * | 11/2006 | Sutardja ..................... 257/729 |

OTHER PUBLICATIONS

Savoj, et al., "A 10Gb/s CMOS Clock and Data Recovery Circuit with Frequency Detection"; IEEE International Solid State Circuits Conference; 2001; 3 pages.

* cited by examiner

*Primary Examiner*—Cassandra Cox
(74) *Attorney, Agent, or Firm*—Meyertons Hood Kivlin Kowert & Goetzel, P.C.; Jeffrey C. Hood

(57) ABSTRACT

An Automatic System Clock Detection System (ASCDS) may provide integrated circuits (ICs) with the capability to detect the frequency of an external crystal oscillator or clock source, and adjust the IC's internal PLL accordingly for proper IC operation. The frequency detection and PLL adjustment may be performed without any additional pins on the IC, and/or without requiring any additional external information. The ASCDS may be configured with an internal ring oscillator, which may be generated from standard logic elements, a watchdog counter, and an input clock counter. When the IC comes out of power on reset (POR), the ASCDS may compare the input clock counter with the watchdog counter, and determine the clock frequency of the input clock. It may then set the PLL parameters to ensure correct IC operation.

23 Claims, 2 Drawing Sheets

AUTOMATIC SYSTEM CLOCK DETECTION SYSTEM

PRIORITY CLAIM

This application claims benefit of priority of provisional application Ser. No. 60/889,431 titled "Automatic System Clock Detection System", filed on Feb. 12, 2007, whose inventors are Shawn Shaojie Li, Akhlesh Nigam, Mark R. Bohm, and Michael J. Pennell, and which is hereby incorporated by reference as though fully and completely set forth herein.

BACKGROUND OF THE INVENTION

1. Field of the Invention

This invention relates to frequency detection circuits, and more specifically to the design of a circuit capable of detecting the frequency of an external clock source and adjust its internal PLL accordingly.

2. Description of the Related Art

In many electronics systems, especially in synchronous digital circuits, a clock signal, oftentimes also referred to as a trigger signal, is used to coordinate the actions of two or more circuits, and/or to predictably trigger system events. A typical clock signal is a square wave oscillating between a high state and a low state, and generally has a 50% duty cycle. Circuits that use a clock signal for synchronization may become active at either the rising or falling edge of the clock signal, or, as in the case of DDR SDRAMs on both the rising and falling edges of the clock signal.

Most integrated circuits (ICs) that reach a certain level of complexity utilize a clock signal in order to synchronize various parts of the circuit and to effectively manage propagation delays. As the complexity of ICs increases, so does the difficulty of supplying accurate, synchronized clocks to the various circuits and logical blocks within the IC. Examples of complex ICs include microcontrollers and microprocessors, the central components of many modern computers and computer based systems. Microprocessors, for example, typically rely on a clock signal derived from a crystal oscillator. Many times a clock signal may be gated, i.e. combined with a controlling signal that enables or disables the clock signal for a certain part of a circuit. Gated clocks are often used to save power by effectively shutting down portions of a digital circuit when they are not in use.

Most current microprocessors and microcontrollers use internally generated single-phase clock signals that are typically derived from external clock sources (such as crystal oscillators) using Phase Locked Loops (PLLs), oftentimes with a "clock multiplier" configured to multiply the lower frequency external clock source signal to obtain the appropriate clock rate of the microprocessor/microcontroller. This typically allows Central Processing Units (CPUs) to operate at a much higher frequency than the rest of the system, affording performance gains when the CPU does not need to wait on external components/signals like memory or Input/Output (I/O) signals, for example.

For most every IC, the internal PLL clock generation circuit generally requires a fixed clock reference at its startup time. In many cases, due mainly to cost, interoperability, availability, and compliance considerations, it is beneficial for original equipment manufacturers (OEMs) to have the capability of choosing different clock frequencies at system startup. Most IC (or chip) vendors do not have a solution for providing a different clock frequency, thus, IC designers have to retrofit their designs to the single clock source limitation or use different chips. When a solution is offered, it usually requires additional pins and/or control signals, which may not readily be available or affordable in certain IC designs.

FIG. 1 shows an example of a system 100 in which specified pins have been allocated as clock sources, with different pin configurations used for indicating different clock source frequencies. These pins are in addition to the input pins 102 and 104, which may be used for coupling an external clock source or a crystal. Clock mode pin 106 may be used to specify the clock source, which may be a crystal, external oscillator, or some other external periodic signal, and clock select pins 108 and 110 (or, any number of pins from 2 to N) may be used to specify the frequency of the clock source. When allocating clock select pins and clock mode pins for configuring the clock as shown in FIG. 1, in order to support different clock source frequencies the external clock source configuration pins 106, 108, and 110 (and/or any additional clock select pins that may be present) have to be configured correctly. Any error in the pin configurations may result in a PLL failure or malfunction. In addition, the extra pins also increase IC development costs, raising the overall cost of the IC by more than just the cost of the additional pins to the IC package.

Other corresponding issues related to the prior art will become apparent to one skilled in the art after comparing such prior art with the present invention as described herein.

SUMMARY OF THE INVENTION

In one set of embodiments, an Automatic System-Clock Detection System (ASCDS) may provide integrated circuits (ICs) with the capability to detect the frequency of an external periodic signal, which may be a clock signal generated by a crystal oscillator or an external clock source, and adjust the IC's internal PLL accordingly for proper IC operation. The frequency detection and PLL adjustment may be performed without any additional pins on the IC, and/or without requiring any additional external information. In one embodiment, the ASCDS is configured with an internal ring oscillator, which may be generated from standard logic elements, a watchdog counter, and an input clock counter. When the IC comes out of power on reset (POR), the ASCDS may compare the input clock counter with the watchdog counter, and determine the clock frequency of the input clock. It may then set the PLL parameters to ensure correct IC operation.

Other aspects of the present invention will become apparent with reference to the drawings and detailed description of the drawings that follow.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
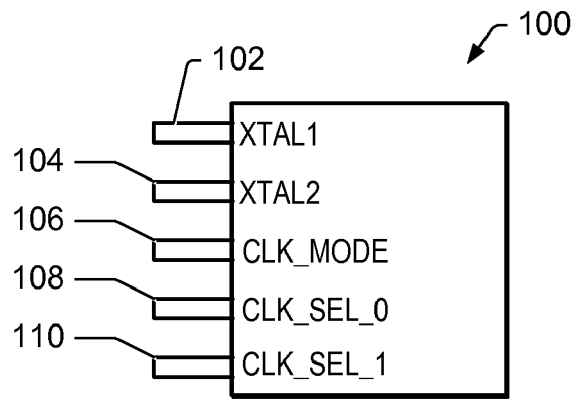
FIG. 1 shows an integrated circuit (IC) with additional pins to allow for multiple clock source configurations, according to prior art.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not to be used to limit or interpret the description or claims. Furthermore, note that the word "may" is used throughout this application in a permissive sense (i.e., having the potential to, being able to), not a mandatory sense (i.e., must)." The term "include" and derivations thereof mean "including, but not limited to". The term "coupled" means "directly or indirectly connected".

DETAILED DESCRIPTION OF THE PREFERRED EMBODIMENTS

In one set of embodiments, an integrated circuit may be configured with an Automatic System-Clock Detection System (ASCDS), which may be operable to identify multiple different external periodic signal modes, or external clock source modes. In one embodiment, the ASCDS may be configured to identify two different external periodic signal modes: an external clock oscillator mode, and a crystal (which may be an external crystal) mode. In another set of embodiments, the ASCDS may be operable to identify three or more different external periodic signal modes. In addition, the ASCDS may also be configured to determine the external clock oscillator frequency when the ASCDS is operating in the external clock oscillator mode, prior to engaging an internal phase locked loop (PLL) for generating an internal periodic signal, or clock signal, based on the external periodic signal, or clock signal.

Figure 2:
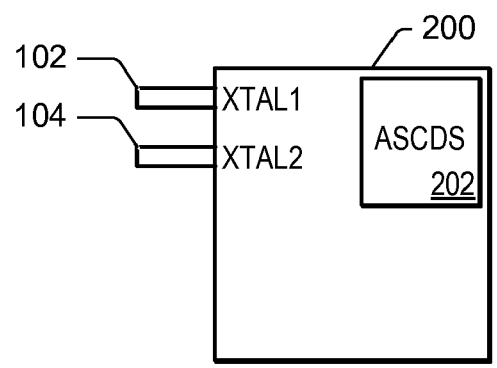
FIG. 2 shows a block diagram of an integrated circuit (IC) that includes an Automatic System-Clock Detection System (ASCDS) to allow for multiple clock source configurations, according to one set of embodiments of the present invention.

FIG. 2 shows a block diagram of one embodiment of an integrated circuit (IC) 200 that includes an ASCDS 202. In contrast to prior art solutions that require multiple configuration pins (e.g. the clock select pins 108 and 110, and clock mode pin 106 of system 100 shown in FIG. 1), an IC 200 configured with ASCDS 202 may only require two input pins, shown as (crystal) input pins 102 and 104, while still allowing for a variety of external periodic signal sources.

Figure 3:
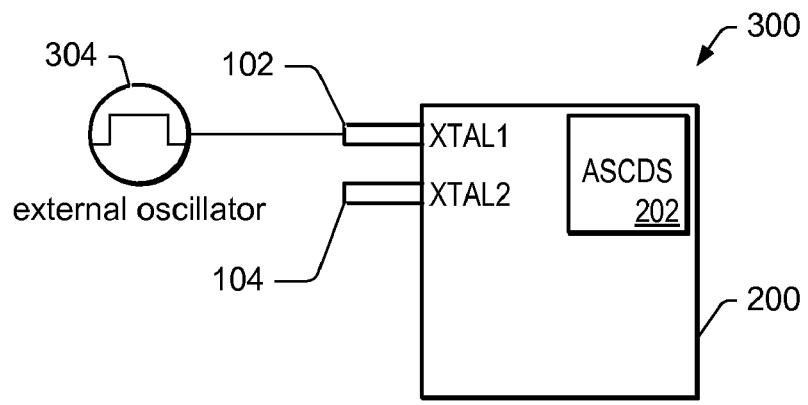
FIG. 3 shows a block diagram of one configuration in which the IC of FIG. 2 is coupled to an external oscillator used as clock source, according to one set of embodiments of the present invention.

FIG. 3 shows a block diagram of one embodiment 300 of IC 200 of FIG. 2 configured with an external oscillator 304 as the external periodic signal (or clock) source. When external oscillator 304 is coupled to IC 200, ASCDS 202 may operate to identify the clock source mode as external oscillator mode. As shown in FIG. 3, external oscillator 304 may be coupled to a single one of the input pins, in this embodiment to input pin 102. While in one set of embodiments ASCDS 202 may be configured to identify an external oscillator coupled to input pin 102, in alternate embodiments ASCDS 202 may be configured to monitor another pin, e.g. pin 104 to which external oscillator 304 may be coupled. In general, depending on the number of input pins configured for coupling external clock and/or other periodic signal sources to IC 200, ASCDS may be configured to monitor any of the pins for an external oscillator.

Figure 4:
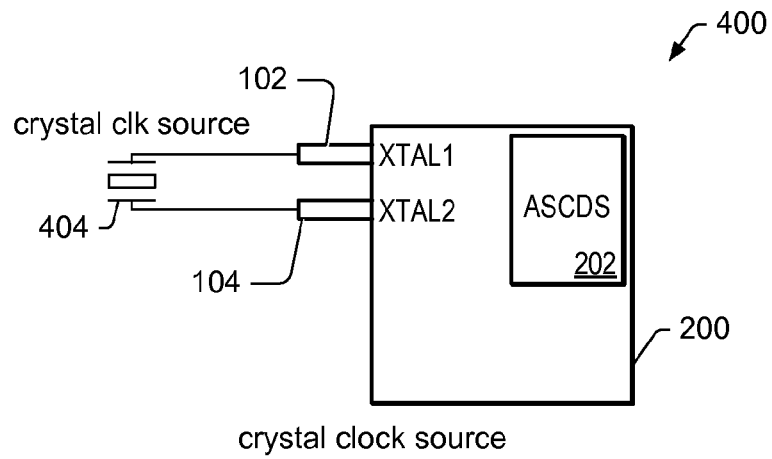
FIG. 4 shows a block diagram of one configuration in which the IC of FIG. 2 coupled to an external crystal used as clock source, according to one set of embodiments of the present invention.

FIG. 4 shows a block diagram of another embodiment 400 of IC 200 of FIG. 2 configured with an external crystal 404 as an external periodic signal (or clock) source. As shown in FIG. 4, external crystal 404 may be coupled across input pins 102 and 104. When external crystal 404 is coupled to IC 200, ASCDS 202 may operate to identify the clock source mode as crystal mode. Thus, in at least one set of embodiments, ASCDS 202 may be configured to identify the source mode as either external oscillator mode or crystal mode based on the signal(s) coupled to input pins 102 and 104. In other embodiments, ASCDS 202 may be configured to identify other types of clock sources according to the internal configuration of ASCDS 202, as further discussed below. It should also be noted that while ASCDS 202 is shown configured on an integrated circuit (IC 200 in the embodiments shown), ASCDS 202 is not limited to reside on an integrated circuit, and may be implemented in a variety of systems where recognition of external clock sources, including type and/or frequency, is desired without requiring more than two input lines and/or input pins.

Figure 5:
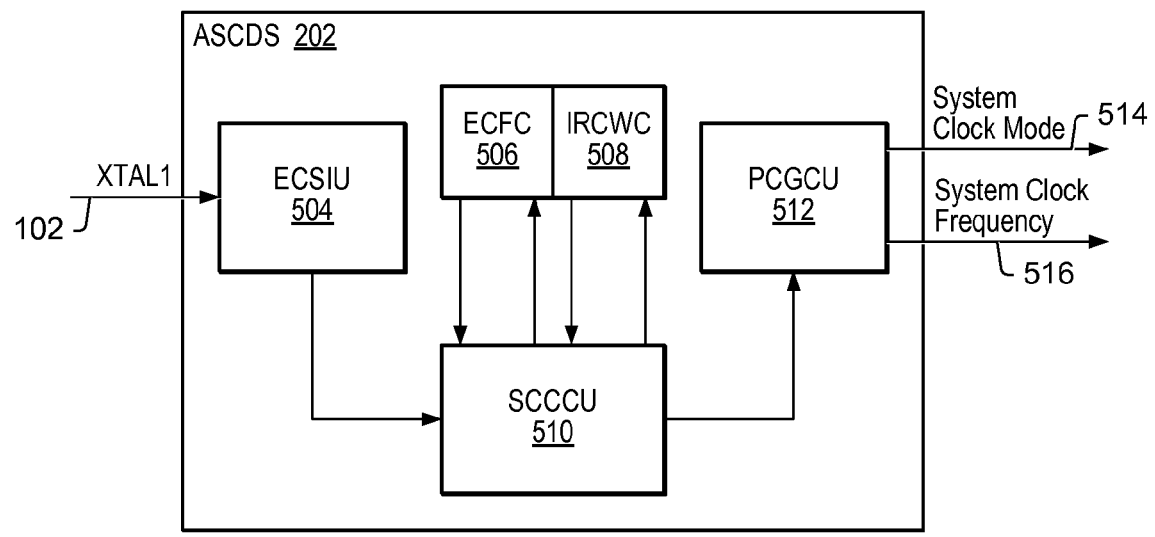
FIG. 5 shows a functional block diagram of one embodiment of the Automatic System-Clock Detection System.

Determining the External Clock Source Mode:

FIG. 5 shows one embodiment of ASCDS 202 configured to determine the external clock source mode and/or frequency of a clock source coupled to at least input pin 102. In the embodiment shown in FIG. 5, an external clock source input unit (ECSIU) may be configured to receive the periodic signal or crystal input of the external clock/periodic signal source via input line 102. In general, ECSIU 504 may be configured to receive whatever signal is coupled or provided to input pin 102. ASCDS 202 may also include internal ring clock watchdog counter (IRCWC) 508 and external clock frequency counter (ECFC) 506 coupled to ECSIU 504 via a system clock configuration control unit (SCCCU) 510. SCCCU 510 may provide a control signal to a PLL (phase locked loop) clock generation control unit (PCGCU) 512, which may operate to provide the identified system clock mode 514 and system clock frequency 516 signals to the system. PCGCU 512 may include a PLL comprising an oscillator. The PLL may be used to obtain the detected system clock frequency 516, and thus provide the appropriate clock signal to be used by the internal logic, which may be coupled to ASCDS 202.

In one set of embodiments, ECSIU 504 may be configured to operate input line 102 at a specified, previously determined threshold (supply) voltage. In general, the threshold voltage for input line 102 may be controlled and/or set by any sub-circuit of ASCDS 202, or any other circuit or circuit component of IC 200 as desired. In one embodiment, the default threshold voltage may be a high voltage (e.g. 3.3 V). When coupling one terminal of an external crystal, such as crystal 404 in FIG. 4, to input line 102 (and the other terminal of the external crystal to input line 104, in some embodiments), the high threshold voltage will in effect inhibit the crystal from oscillating. Thus, monitoring input line 102 would result in not detecting any change on input line 102. When coupling an external oscillator, such as oscillator 304 in FIG. 3, to input line 102, the high threshold voltage will not have the inhibiting effect that it may have on an external crystal, and thus input line 102 will reflect the changes corresponding to the periodic signal generated by the external oscillator.

Therefore, ECSIU 504 may be configured to monitor input line 102 to detect if the signal level on input line 102 is changing. When a system comprising ASCDS 202 (e.g. IC 200 from FIGS. 2-4) is powered up, both IRCWC 508 and ECFC 506 may be activated. In one embodiment, PCGCU 512 may intentionally be held in an inactive stage, and activated only after IRCWC 508 has expired. Under these conditions, system clock mode signal 514 may reflect that an external source is being detected, and the system clock frequency signal 516 may indicate that no internal (or system) periodic signal is yet being generated by PCGCU 512. IRCWC 508 may begin counting down from a specified, previously determined initial value, and eventually expire. In one set of embodiments, ECFC 506 may be configured to only accumulate, that is, ECFC 506 may be configured to only advance/count up when a change on input line 102 has been detected. The starting value of ECFC 506 may be selected to be any desired initial value, for example 0.

If no change has been detected on input line 102 by the time IRCWC has expired, the external source may be assumed to be a crystal, and the operating threshold voltage of input line 102 may be switched to a low voltage (e.g. 1.8 V) to allow for proper operation of the external crystal, allowing detection of the periodic signal generated by the external crystal. ECFC 506 may be configured to hold its current value, in other words to not accumulate (or count up), if there is no change on input line 102 (indicating a crystal as the external source). ECFC 506 may accumulate if changes on input line 102 have been detected (indicating an oscillator as the external clock source) with the accumulation (count) based on the frequency of the external clock source. Thus, ECFC 506 may be accumulating while IRCWC 508 is counting down. ECSIU 504 may provide SCCCU 510 with a signal based on the external periodic signal received over input line 102. SCCCU 510 may be configured to determine, upon expiration of watchdog timer 508, the external clock source mode of the input signal received over input line 102. In one embodiment, SCCCU 510 may recognize crystal mode if ECFC 506 remains at a previously determined starting value, e.g. zero, upon expiration of watchdog timer 508. Otherwise, SCCCU 510 may determine that the IC is running in external oscillator mode.

Determining the External Oscillator and/or Crystal Frequency:

If SCCCU 510 has determined that the external clock source is an oscillator, that is, the external source mode corresponds to oscillator mode, the external clock frequency (ECF) may be determined by using the formula: ECF=IF*FV/IV, where IF is the frequency of an internal oscillator (e.g. a ring oscillator) comprised in a PLL configured in PCGCU 512, FV is the final value of ECFC 506 (that is, the value of ECFC 506 that is read upon expiration of IRCWC 508), and IV is the specified initial value from which IRCWC 508 may be set to count down.

If SCCCU 510 has initially determined upon expiration of IRCWC 508 that the external clock source is a crystal, the threshold voltage on input line 102 may be switched to the lower voltage to enable the external crystal to oscillate (as explained above), and SCCCU 510 may reset IRCWC 508, then activate PCGCU 512, and both ECFC 506 and IRCWC 508. Since the external crystal may now operate to provide a periodic signal at input line 102, there will be changes on input line 102, which may result ECFC 506 counting up (accumulating). Upon expiration of IRCWC 508, SCCCU 510 may determine the crystal clock frequency using the same formula (given above) as the one used for determining the frequency when the source of the external periodic signal has been identified as being an oscillator.

Upon having determined the external clock source mode and the external clock frequency, SCCCU 510 may provide clock control information indicating the external clock source mode and external clock frequency to PCGCU 512, and may reactivate PCGCU 512. At this time, PCGCU 512 may start generating the appropriate clock sources to be used by the internal logic that may be coupled to ASCDS 202.

One notable difference between prior art systems (e.g. the system shown in FIG. 1) is the obviated need for any additional pins to support more than one clock source when including an ASCDS 202 in a system or in an IC. A lower pin count most often results in less development time and lower costs. In addition, systems configured with an ASCDS may not be prone to configuration mismatch issues since the frequency of the external clock source may be determined in real time during regular circuit operation (e.g. at start-up of the system). The auto-detection may therefore improve the system's overall serviceability, usability, reliability and flexibility.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A system comprising:
    a source input configured to receive an external periodic signal;
    a periodic signal generation circuit configured to receive control information and generate an internal periodic signal according to the control information; and
    a detection circuit coupled to the periodic signal generation circuit and to the source input, and operable to:
        determine, based on the external periodic signal, a source of the external periodic signal;
        determine, based on the external periodic signal, a frequency of the external periodic signal; and
        generate the control information, wherein the control information comprises information indicative of the source of the external periodic signal and the frequency of the external periodic signal.

2. The system of claim 1, wherein the internal periodic signal and the external periodic signals are clock signals.

3. The system of claim 1, wherein the source of the external periodic signal is one of:
    a crystal; and
    an external oscillator.

4. The system of claim 1, wherein the periodic signal generation circuit comprises a phase locked loop (PLL) circuit.

5. The system of claim 4, wherein the PLL circuit comprises a ring oscillator.

6. A method for automatically detecting a system clock, the method comprising:
    receiving an external periodic signal;
    determining a source and a frequency of the external periodic signal from the external periodic signal;
    generating control information indicative of the source and the frequency of the external periodic signal; and
    generating a system periodic signal according to the control information.

7. The method of claim 6, wherein said determining the source and the frequency of the external periodic signal comprises:
    counting down from an initial value to a first value using a first counter;

counting up from a second value using a second counter, wherein said counting up is performed simultaneously with said counting down; and reading a current value of the second counter to obtain a final value of the second counter once said counting down to the first value has completed, wherein the final value of the second counter is indicative of the source of the external periodic signal.

8. The method of claim 7, wherein said receiving the external periodic signal comprises receiving the external periodic signal over at least a first signal line; and wherein said counting up from the second value comprises incrementing the current value of the second counter every time there is a change on the at least first signal line.

9. The method of claim 7, wherein if the final value of the second counter is the second value, then the final value of the second counter is indicative of a crystal as the source of the external periodic signal; and wherein if the final value of the second counter is not the second value, then the final value of the second counter is indicative of an oscillator as the source of the external periodic signal.

10. The method of claim 7, wherein said generating the system periodic signal is performed using an internal oscillator having a given frequency;

wherein said determining the source and the frequency of the external periodic signal further comprises calculating the frequency of the external periodic signal from the given frequency of the internal oscillator, the initial value of the first counter, and the final value of the second counter.

11. A system comprising:

a first input terminal configured to couple to an external signal source operable to generate a first periodic signal;

a first circuit configured to receive control information and to generate a second periodic signal according to the control information; and a second circuit coupled to the first circuit and to the first input terminal, wherein the second circuit is operable to:

determine a type of the external signal source based on signal activity at the first input terminal;

determine a frequency of the first periodic signal based on the signal activity at the first input terminal; and generate the control information, wherein the control information comprises information indicative of the type of the external signal source and the frequency of the first periodic signal.

12. The system of claim 11, wherein the second circuit comprises:

a first counter operable to count down from an initial value to a first value;

a second counter operable to count up from a second value, simultaneously with the first counter counting down from the initial value;

wherein the second circuit is further operable to obtain a final value of the second counter when the first counter has reached the first value, wherein the final value of the second counter is indicative of the type of the external signal source.

13. The system of claim 12, wherein the system is operable to:

activate the first counter and the second counter upon the system powering up; and disable the first circuit until the first counter has reached the first value.

14. The system of claim 12, wherein the first circuit is configured to generate the second periodic signal according to the control information and an internal oscillator having a first frequency.

15. The system of claim 14, wherein the second circuit is operable to determine the frequency of the first periodic signal from the initial value of the first counter, the final value of the second counter, and the internal oscillator frequency.

16. The system of claim 12, wherein the second counter is configured to remain at the second value when no signal activity is detected at the first input terminal;

wherein the second circuit is further operable to:

determine that the external signal source is of a first type when the final value of the second counter is the second value; and determine that the external signal source is of a second type when the final value of the second counter is not the second value.

17. The system of claim 11, wherein the first input terminal is configured to operate at an operating voltage that is one of at least a first voltage and a second voltage, wherein the first voltage is higher than the second voltage;

wherein the system is operable to initially set the operating voltage to the first voltage;

wherein the second circuit is further operable to:

determine that the external signal source is of a first type when the operating voltage is the first voltage and no signal activity is detected at the first input terminal; and determine that the external signal source is of a second type when the operating voltage is the first voltage and signal activity is detected at the first input terminal.

18. The system of claim 17, wherein the second circuit comprises:

a first counter operable to count down from an initial value to a first value;

a second counter operable to:

count up from a second value, simultaneously with the first counter counting down from the initial value;

remain at the second value when no signal activity is detected at the first input terminal;

wherein the second circuit is further operable to obtain a final value of the second counter when the first counter has reached the first value, wherein the final value of the second counter is indicative of type of the external signal source.

19. The system of claim 18, wherein upon having determined that the external signal source is of the first type, the system is operable to set the operating voltage to the second voltage; and the second circuit is operable to:

reset the first counter to the initial value; and start the first counter and the second counter.

20. A method for detecting an external clock source, the method comprising:

monitoring a first input terminal configured to couple to an external signal source operable to generate a first periodic signal;

identifying the external signal source as being of a first type in response to said monitoring indicating that there is signal activity at the first input terminal;

determining a frequency of the first periodic signal based on the first periodic signal and in response to said identifying; and generating a second periodic signal according to the determined frequency of the first periodic signal and according to said identifying the external signal source as being of the first type.

21. The method of claim 20, wherein the external signal source being of the first type comprises the external signal source being an oscillator.

22. A method for detecting an external clock source, the method comprising:

monitoring a first input terminal configured to couple to an external signal source operable to generate a first periodic signal;

identifying the external signal source as being of a first type in response to said monitoring indicating that there is no signal activity at the first input terminal;

changing an operating voltage of the first input terminal in response to said identifying the external signal source as being of the first type;

detecting signal activity at the first terminal in response to said changing the operating voltage of the first input terminal;

determining a frequency of the first periodic signal based on the first periodic signal and in response to said detecting; and generating a second periodic signal according to the determined frequency of the first periodic signal and according to said identifying the external signal source as being of the first type.

23. The method of claim 22, wherein the external signal source being of the first type comprises the external signal source being a crystal.

* * * * *